US012777779B2

(12) United States Patent
Shiomi et al.

(10) Patent No.: US 12,777,779 B2
(45) Date of Patent: Oct. 27, 2026

(54) DISPLAY DEVICE

(71) Applicant: Magnolia White Corporation, Tokyo (JP)

(72) Inventors: Naoki Shiomi, Tokyo (JP); Jun Hanari, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 436 days.

(21) Appl. No.: 18/450,423

(22) Filed: Aug. 16, 2023

(65) Prior Publication Data

US 2024/0065039 A1 Feb. 22, 2024

(30) Foreign Application Priority Data

Aug. 19, 2022 (JP) ................................ 2022-131126

(51) Int. Cl.

| | |
|---|---|
| ***H10K 59/122*** | (2023.01) |
| ***H10K 59/80*** | (2023.01) |
| *H10K 59/12* | (2023.01) |
| *H10K 102/00* | (2023.01) |
| *H10K 102/10* | (2023.01) |

(52) U.S. Cl.

CPC ..... *H10K 59/122* (2023.02); *H10K 59/80518* (2023.02); *H10K 59/80524* (2023.02); *H10K 59/1201* (2023.02); *H10K 2102/103* (2023.02); *H10K 2102/351* (2023.02)

(58) Field of Classification Search

None

See application file for complete search history.

(56) References Cited

U.S. PATENT DOCUMENTS

| | | | | |
|---|---|---|---|---|
| 2004/0160170 | A1 | 8/2004 | Sato et al. | |
| 2009/0009069 | A1 * | 1/2009 | Takata ................ | H10K 59/122 445/24 |
| 2019/0363275 | A1 | 11/2019 | Ochi et al. | |
| 2022/0077251 | A1 | 3/2022 | Choung et al. | |

FOREIGN PATENT DOCUMENTS

| | | | |
|---|---|---|---|
| JP | 2000-195677 | A | 7/2000 |
| JP | 2004-207217 | A | 7/2004 |
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

*Primary Examiner* — Donald L Raleigh

(74) *Attorney, Agent, or Firm* — XSENSUS LLP

(57) ABSTRACT

According to an embodiment, a display device includes a lower electrode, a rib including a pixel aperture, a partition including a lower portion and an upper portion, an organic layer covering the lower electrode through the pixel aperture, and an upper electrode covering the organic layer. The rib includes a taper portion which surrounds the pixel aperture and in which a thickness decreases toward the pixel aperture. The organic layer includes an end portion on the rib and a thickness deceasing portion in which a thickness decreases toward the end portion. Further, the thickness decreasing portion covers at least part of the taper portion.

27 Claims, 17 Drawing Sheets

DISPLAY DEVICE

CROSS-REFERENCE TO RELATED APPLICATIONS

This application is based upon and claims the benefit of priority from Japanese Patent Application No. 2022-131126, filed Aug. 19, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves the yield of the manufacturing process is required.

DETAILED DESCRIPTION

Figure 1:
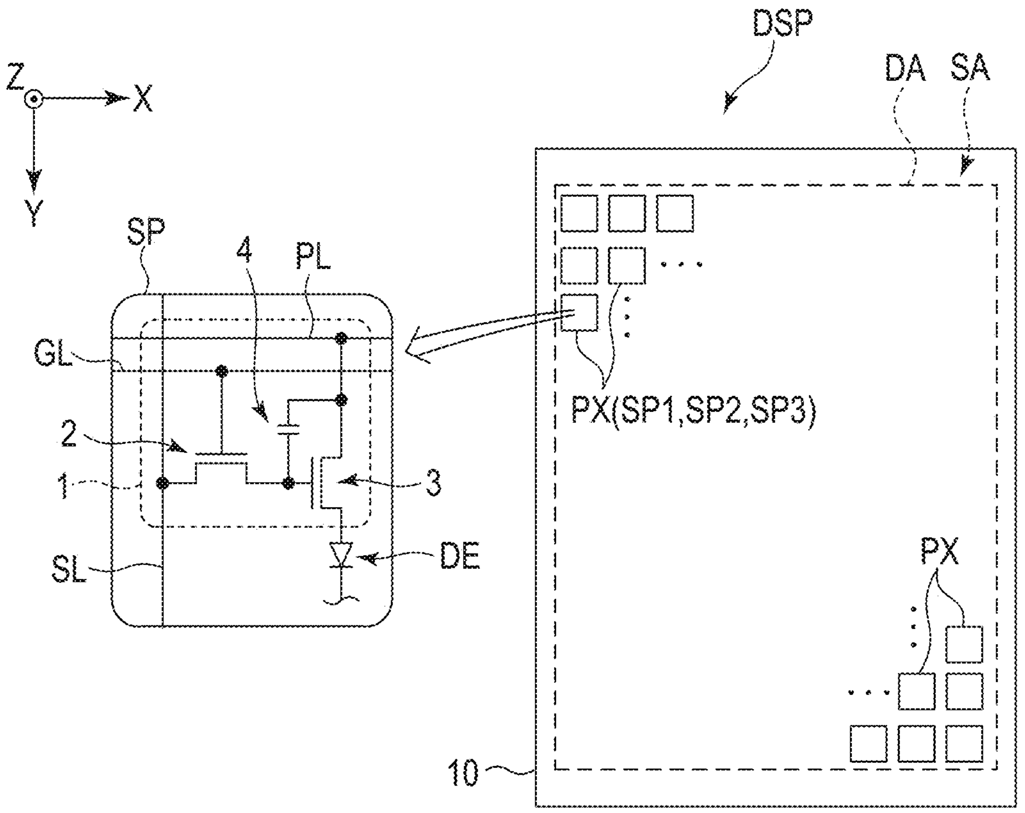
FIG. 1 is a diagram showing a configuration example of a display device according to a first embodiment.

In general, according to one embodiment, a display device comprises a lower electrode, a rib comprising a pixel aperture which overlaps the lower electrode, a partition including a lower portion provided on the rib and an upper portion which protrudes from a side surface of the lower portion, an organic layer which covers the lower electrode through the pixel aperture and emits light based on application of voltage, and an upper electrode which covers the organic layer and is in contact with the side surface of the lower portion. The rib comprises a taper portion which surrounds the pixel aperture and in which a thickness decreases toward the pixel aperture. The organic layer comprises an end portion located on the rib and a thickness deceasing portion in which a thickness decreases toward the end portion. The thickness decreasing portion covers at least part of the taper portion.

According to another aspect of the embodiment, a display device comprises a first lower electrode, a second lower electrode, a rib comprising a first pixel aperture which overlaps the first lower electrode and a second pixel aperture which overlaps the second lower electrode, a partition including a lower portion which is provided on the rib between the first pixel aperture and the second pixel aperture and an upper portion which protrudes from a side surface of the lower portion, a first organic layer which covers the first lower electrode through the first pixel aperture and emits light based on application of voltage, a second organic layer which covers the second lower electrode through the second pixel aperture and emits light based on application of voltage, a first upper electrode which covers the first organic layer and is in contact with a first side surface of the lower portion, and a second upper electrode which covers the second organic layer and is in contact with a second side surface of the lower portion. A first distance between the first side surface and the first pixel aperture is different from a second distance between the second side surface and the second pixel aperture.

According to yet another aspect of the embodiment, a display device comprises a first lower electrode, a second lower electrode, a rib comprising a first pixel aperture which overlaps the first lower electrode and a second pixel aperture which overlaps the second lower electrode, a partition including a lower portion which is provided on the rib between the first pixel aperture and the second pixel aperture and an upper portion which protrudes from a side surface of the lower portion, a first organic layer which covers the first lower electrode through the first pixel aperture and emits light based on application of voltage, a second organic layer which covers the second lower electrode through the second pixel aperture and emits light based on application of voltage, a first upper electrode which covers the first organic layer and is in contact with a first side surface of the lower portion, and a second upper electrode which covers the second organic layer and is in contact with a second side surface of the lower portion. A first distance between the first side surface and the first pixel aperture is greater than a second distance between the second side surface and the second pixel aperture.

These configurations can provide a display device in which the yield of the manufacturing process can be improved.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various types of elements are viewed parallel to the third direction Z, the appearance is defined as a plan view.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

Figure 2:
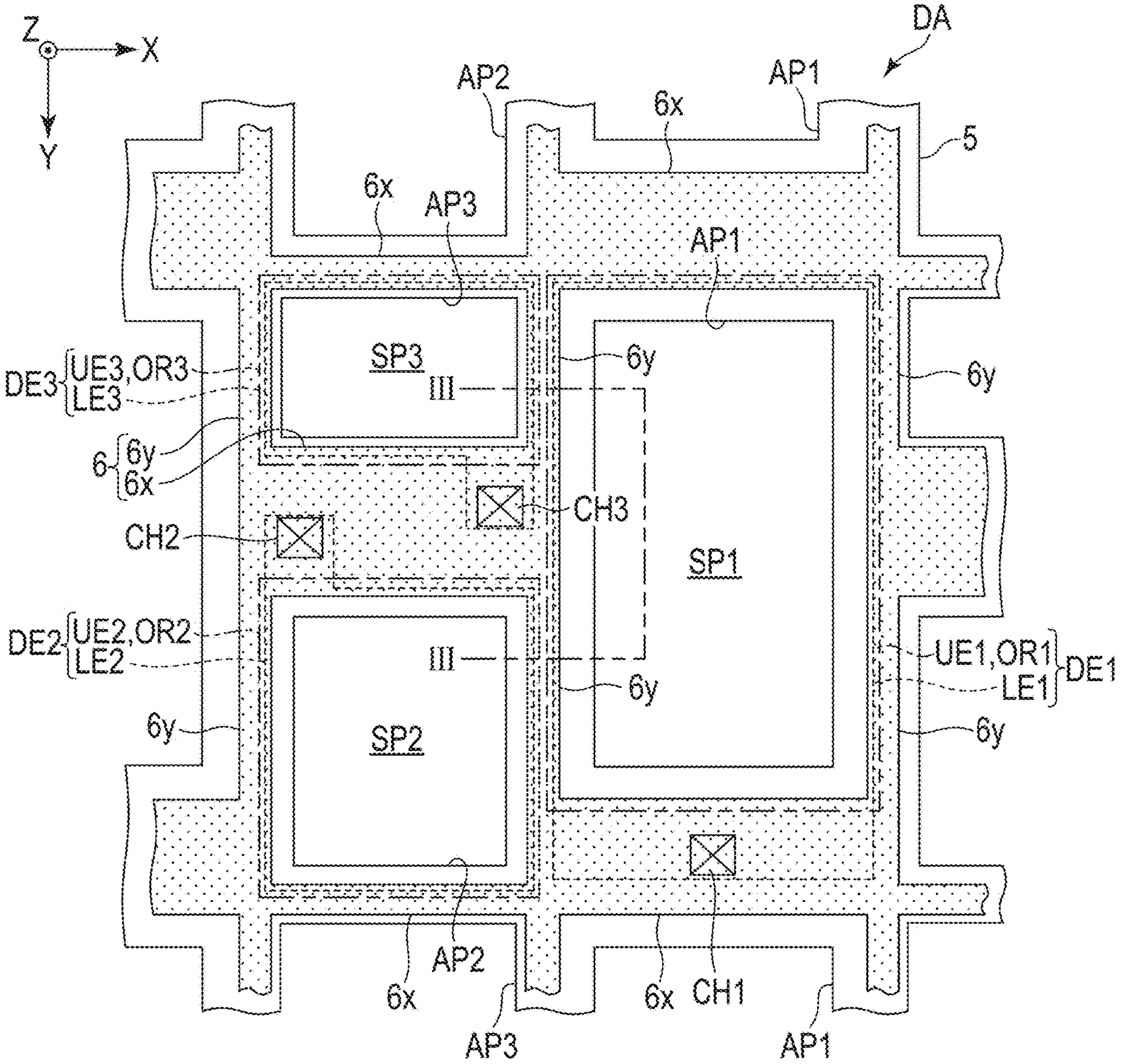
FIG. 2 is a diagram showing an example of the layout of subpixels.

FIG. 2 is a diagram showing an example of the layout of subpixels SP1, SP2 and SP3. In the example of FIG. 2, subpixels SP1 and SP2 are arranged in the first direction X. Subpixels SP1 and SP3 are also arranged in the first direction X. Further, subpixels SP2 and SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a pixel aperture AP1 in subpixel SP1, comprises a pixel aperture AP2 in subpixel SP2 and comprises a pixel aperture AP3 in subpixel SP3.

In the example of FIG. 2, the area of the pixel aperture AP1 is greater than that of the pixel aperture AP2. The area of the pixel aperture AP1 is greater than that of the pixel aperture AP3. Further, the area of the pixel aperture AP3 is less than that of the pixel aperture AP2.

The partition 6 is provided in the boundary between adjacent subpixels SP and overlaps the rib 5 as seen in plan view. The partition 6 comprises a plurality of first partitions 6*x* extending in the first direction X and a plurality of second partitions 6*y* extending in the second direction Y. The first partitions 6*x* are provided between the pixel apertures AP2 and AP3 which are adjacent to each other in the second direction Y and between two pixel apertures AP1 which are adjacent to each other in the second direction Y. Each second partition 6*y* is provided between the pixel apertures AP1 and AP2 which are adjacent to each other in the first direction X and between the pixel apertures AP1 and AP3 which are adjacent to each other in the first direction X.

In the example of FIG. 2, the first partitions 6*x* and the second partitions 6*y* are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

The lower electrode LE1, the upper electrode UE1 and the organic layer OR1 constitute the display element DE1 of subpixel SP1. The lower electrode LE2, the upper electrode UE2 and the organic layer OR2 constitute the display element DE2 of subpixel SP2. The lower electrode LE3, the upper electrode UE3 and the organic layer OR3 constitute the display element DE3 of subpixel SP3. Each of the display elements DE1, DE2 and DE3 may include a cap layer as described later.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH2 and CH3 entirely overlap the first partition 6X between the pixel apertures AP2 and AP3 which are adjacent to each other in the second direction Y. The contact hole CH1 entirely overlaps the first partition 6*x* between two pixel apertures AP1 which are adjacent to each other in the second direction Y. As another example, at least part of the contact hole CH1, CH2 or CH3 may not overlap the first partition 6*x*.

Figure 3:
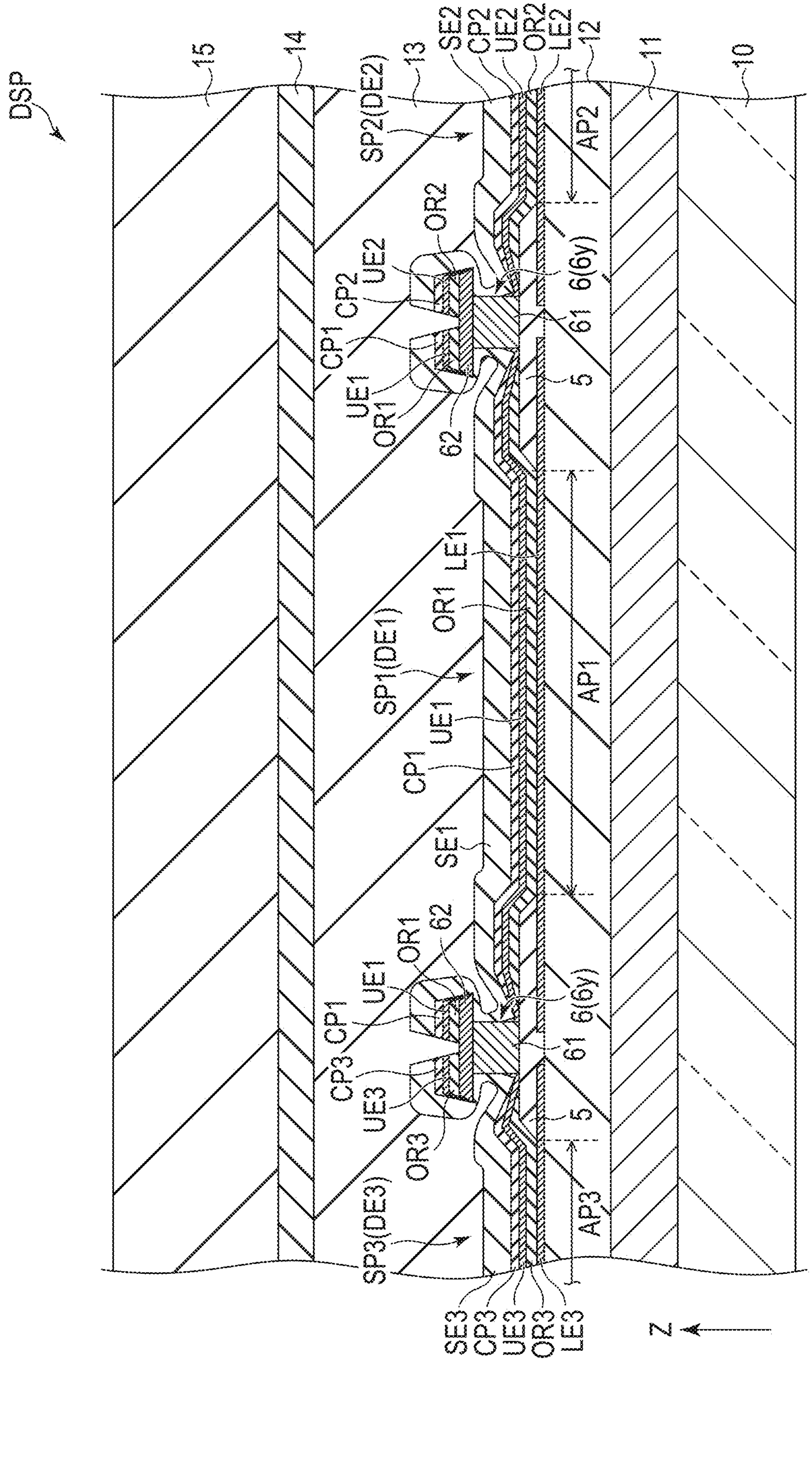
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 is called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3.

In the example of FIG. 3, cap layers CP1, CP2 and CP3 are provided in subpixels SP1, SP2 and SP3, respectively. The cap layer CP1 covers the upper electrode UE1. The cap layer CP2 covers the upper electrode UE2. The cap layer CP3 covers the upper electrode UE3.

Further, sealing layers SE1, SE2 and SE3 are provided in subpixels SP1, SP2 and SP3, respectively. The sealing layer SE1 continuously covers, of the partition 6 surrounding subpixel SP1, a portion which is close to subpixel SP1, and the cap layer CP1. The sealing layer SE2 continuously covers, of the partition 6 surrounding subpixel SP2, a portion which is close to subpixel SP2, and the cap layer CP2. The sealing layer SE3 continuously covers, of the partition 6 surrounding subpixel SP3, a portion which is close to subpixel SP3, and the cap layer CP3.

The organic layer OR1, the upper electrode UE1 and the cap layer CP1 are partly located on the upper portion 62. These portions are spaced apart from, of the organic layer OR1, the upper electrode UE1 and the cap layer CP1, the portions located on the rib 5. Similarly, the organic layer OR2, the upper electrode UE2 and the cap layer CP2 are partly located on the upper portion 62, and these portions are spaced apart from, of the organic layer OR2, the upper electrode UE2 and the cap layer CP2, the portions located on the rib 5. Further, the organic layer OR3, the upper electrode UE3 and the cap layer CP3 are partly located on the upper portion 62, and these portions are spaced apart from, of the organic layer OR3, the upper electrode UE3 and the cap layer CP3, the portions located on the rib 5.

In the example of FIG. 3, the organic layer OR1, the upper electrode UE1, the cap layer CP1 and the sealing layer SE1 on the partition 6 between subpixels SP1 and SP2 are spaced apart from the organic layer OR2, the upper electrode UE2, the cap layer CP2 and the sealing layer SE2 on this partition 6. The organic layer OR1, the upper electrode UE1, the cap layer CP1 and the sealing layer SE1 on the partition 6 between subpixels SP1 and SP3 are spaced apart from the organic layer OR3, the upper electrode UE3, the cap layer CP3 and the sealing layer SE3 on this partition 6.

The sealing layers SE1, SE2 and SE3 are covered with a resin layer 13. The resin layer 13 is covered with a sealing layer 14. Further, the sealing layer 14 is covered with a resin layer 15.

Each of the organic insulating layer 12 and the resin layers 13 and 15 is formed of an organic material. Each of the rib 5, the sealing layers SE1, SE2 and SE3 and the sealing layer 14 is formed of, for example, an inorganic material such as silicon nitride (SiNx), silicon oxide (SiOx) or silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may include a plurality of light emitting layers.

Each of the upper electrodes UE1, UE2 and UE3 is formed of, for example, a metal material such as an alloy of magnesium and silver (MgAg). For example, the lower electrodes LE1, LE2 and LE3 correspond to the anodes of the display elements DE1, DE2 and DE3, respectively. The upper electrodes UE1, UE2 and UE3 correspond to the cathodes of the display elements DE1, DE2 and DE3, respectively.

Each of the cap layers CP1, CP2 and CP3 is formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

Figure 4:
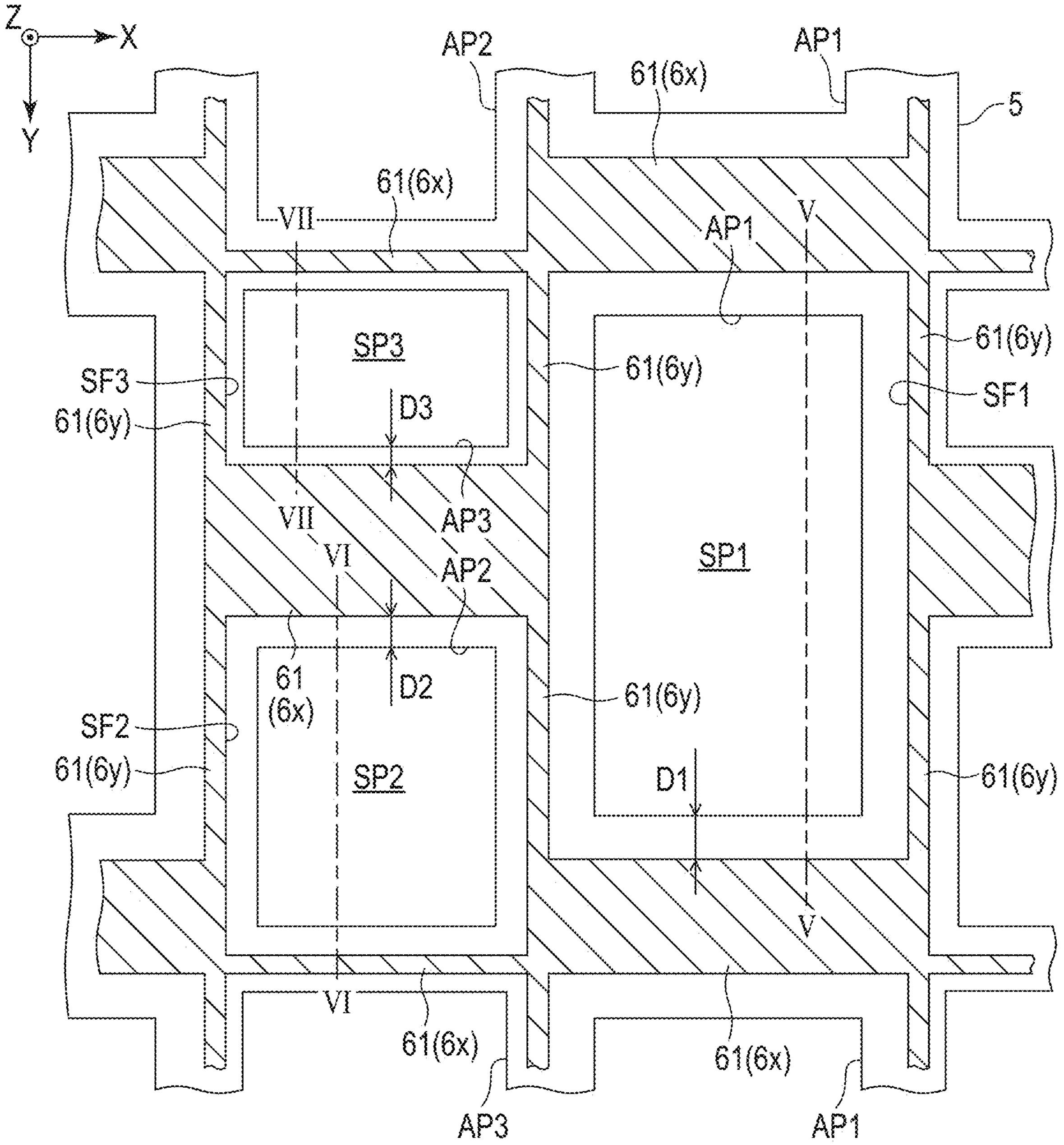
FIG. 4 is a schematic plan view of a rib and a partition.

FIG. 4 is a schematic plan view of the rib 5 and the lower portion 61 of the partition 6. The lower portion 61 comprises a side surface SF1 which surrounds the pixel aperture AP1, a side surface SF2 which surrounds the pixel aperture AP2 and a side surface SF3 which surrounds the pixel aperture AP3. In the following explanation, the distance between the pixel aperture AP1 and the side surface SF1 is defined as D1. The distance between the pixel aperture AP2 and the side surface SF2 is defined as D2. The distance between the pixel aperture AP3 and the side surface SF3 is defined as D3.

In the present embodiment, distances D1, D2 and D3 are different from each other. Specifically, distance D2 is less than distance D1, and distance D3 is less than distance D2 (D1>D2>D3).

In the example of FIG. 4, distance D1 is constant over the whole circumference of the pixel aperture AP1. Distance D2 is constant over the whole circumference of the pixel aperture AP2. Distance D3 is constant over the whole circumference of the pixel aperture AP3. However, the configuration is not limited to this example. Distances D1, D2 and D3 may partly vary in the circumferences of the pixel apertures AP1, AP2 and AP3, respectively. For example, the distance between the pixel aperture AP1 and the side surface SF1 of the first partition 6*x* may be different from the distance between the pixel aperture AP1 and the side surface SF1 of the second partition 6*y*. A similar configuration can be applied to the pixel apertures AP2 and AP3.

Figure 5:
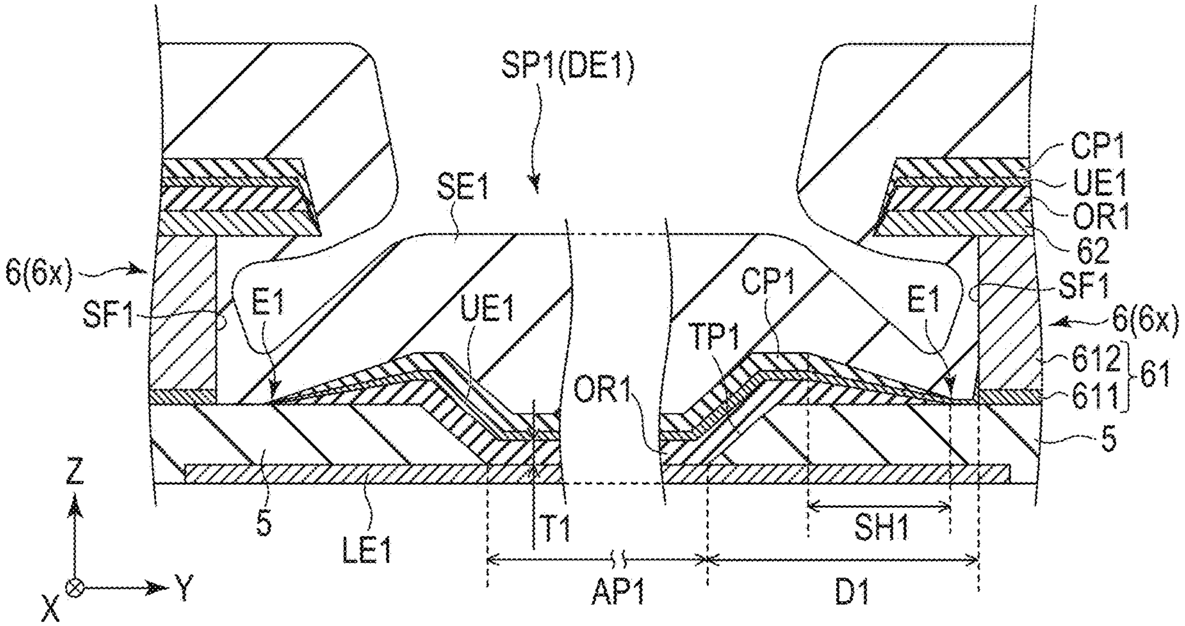
FIG. 5 is a schematic cross-sectional view of the display device along the V-V line of FIG. 4.
Figure 6:
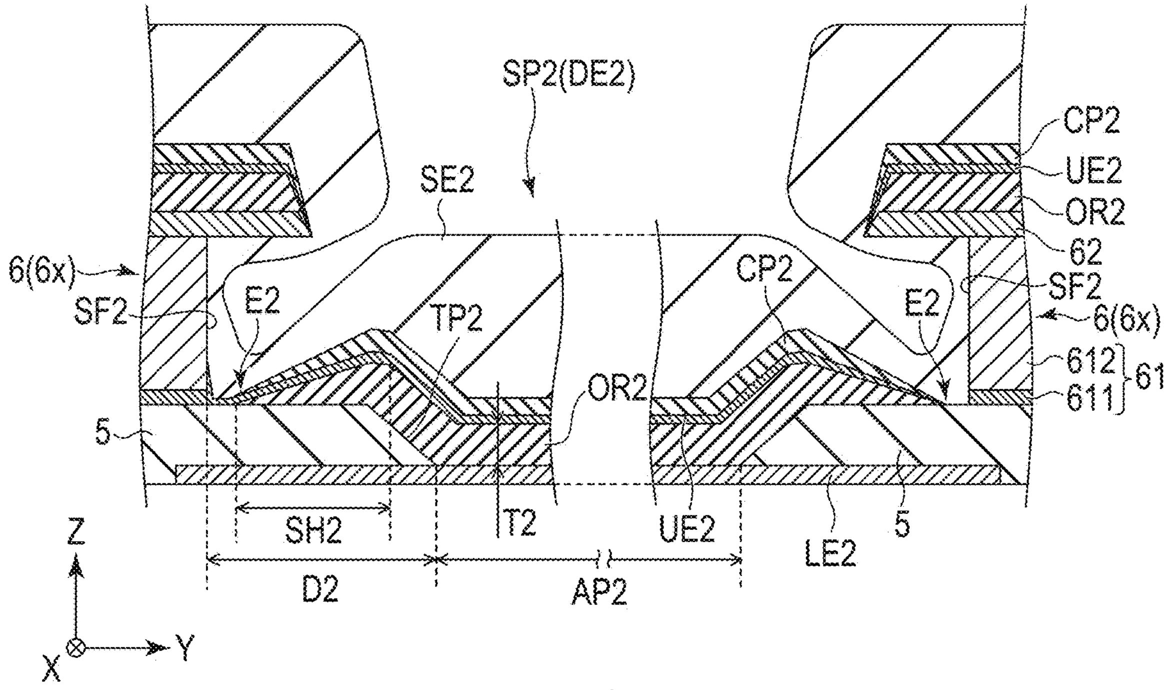
FIG. 6 is a schematic cross-sectional view of the display device along the VI-VI line of FIG. 4.
Figure 7:
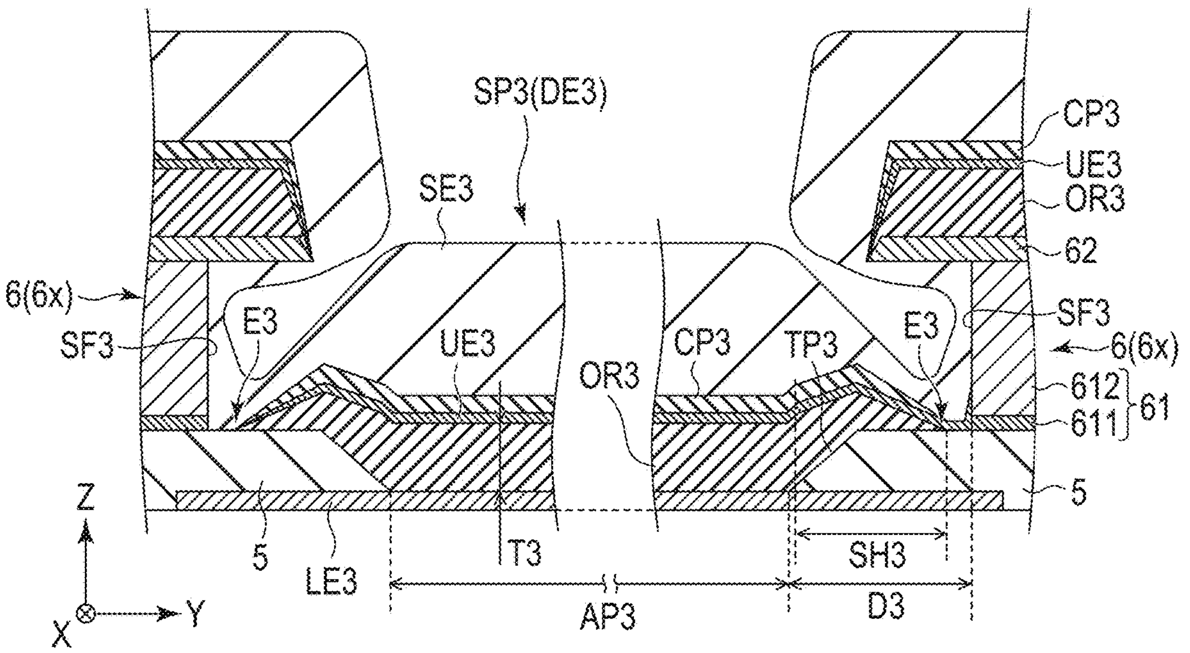
FIG. 7 is a schematic cross-sectional view of the display device along the VII-VII line of FIG. 4.

FIG. 5 is a schematic cross-sectional view of the display device DSP along the V-V line of FIG. 4, and shows subpixel SP1 and part of the partition 6 (first partition 6*x*) around the subpixel. FIG. 6 is a schematic cross-sectional view of the display device DSP along the VI-VI line of FIG. 4, and shows subpixel SP2 and part of the partition 6 (first partition 6*x*) around the subpixel. FIG. 7 is a schematic cross-sectional view of the display device DSP along the VII-VII line of FIG. 5, and shows subpixel SP3 and part of the partition 6 (first partition 6*x*) around the subpixel. Each of the sections of FIG. 5 to FIG. 7 is taken along the Y-Z plane. In FIG. 5 to FIG. 7, the substrate 10, the circuit layer 11, the organic insulating layer 12, the resin layer 13, the sealing layer 14 and the resin layer 15 are omitted.

As shown in FIG. 5 to FIG. 7, the lower portion 61 of the partition 6 includes a first metal layer 611 and a second metal layer 612. The first metal layer 611 is provided on the rib 5. The second metal layer 612 is formed so as to be thicker than the first metal layer 611 and is provided on the first metal layer 611.

The first metal layer 611 may be formed of, for example, molybdenum (Mo). The second metal layer 612 may be formed of, for example, aluminum (Al). The second metal layer 612 may be formed of an aluminum alloy such as an aluminum-neodymium alloy (AlNd) or may comprise a multilayer structure consisting of an aluminum layer and an aluminum alloy layer. The lower portion 61 may not include the first metal layer 611.

The upper portion 62 of the partition 6 is formed of, for example, a metal material such as titanium (Ti). The upper portion 62 may comprise a multilayer structure consisting of a metal material and a conductive oxide such as ITO. Alternatively, the upper portion 62 may be formed of an inorganic insulating material such as silicon oxide, or may comprise a multilayer structure consisting of an inorganic insulating material and a conductive oxide such as ITO.

In the example of FIG. 5, the upper electrode UE1 is in contact with the side surface SF1 of the right partition 6 and is not in contact with the side surface SF1 of the left partition 6. The right partition 6 which is in contact with the upper electrode UE1 corresponds to the first partition 6*x* which overlaps the contact hole CH1 in FIG. 2.

In the example of FIG. 6, the upper electrode UE2 is in contact with the side surface SF2 of the left partition 6 and is not in contact with the side surface SF2 of the right partition 6. The left partition 6 which is in contact with the upper electrode UE2 corresponds to the first partition 6*x* which overlaps the contact hole CH2 in FIG. 2.

In the example of FIG. 7, the upper electrode UE3 is in contact with the side surface SF3 of the right partition 6 and is not in contact with the side surface SF3 of the left partition 6. The right partition 6 which is in contact with the upper electrode UE3 corresponds to the first partition 6*x* which overlaps the contact hole CH3 in FIG. 2.

As shown in FIG. 5 to FIG. 7, the organic layers OR1, OR2 and OR3 have thicknesses T1, T2 and T3, respectively. Thickness T1 corresponds to the thickness of, of the organic layer OR1, the portion which overlaps the pixel aperture AP1. Thickness T2 corresponds to the thickness of, of the organic layer OR2, the portion which overlaps the pixel aperture AP2. Thickness T3 corresponds to the thickness of, of the organic layer OR3, the portion which overlaps the pixel aperture AP3.

In the present embodiment, thicknesses T1, T2 and T3 are different from each other. Specifically, thickness T2 is greater than thickness T1, and thickness T3 is greater than thickness T2 ($T1<T2<T3$). Thicknesses T1, T2 and T3 are determined so as to realize a good light extraction efficiency from the display elements DE1, DE2 and DE3 based on the wavelengths of the light emitted from the organic layers OR1, OR2 and OR3. For example, when the organic layers OR1, OR2 and OR3 emit light in blue, green and red wavelength ranges, respectively, thickness T1 is 200±20 nm, and thickness T2 is 250±20 nm, and thickness T3 is 300±20 nm. These thicknesses T1, T2 and T3 can be also applied to a tandem structure in which each of the organic layers OR1, OR2 and OR3 comprises two light emitting layers.

In the section of FIG. 5, an end portion E1 of the organic layer OR1 is located on the rib 5. The organic layer OR1 comprises a thickness decreasing portion SH1 in which the thickness gradually decreases toward the side surface SF1 and the end portion E1. Of the upper electrode UE1 and the cap layer CP1, the thickness of the portions located on the thickness decreasing portion SH1 also gradually decreases toward the side surface SF1.

The rib 5 comprises a taper portion TP1 in which the thickness gradually decreases toward the pixel aperture AP1. The thickness decreasing portion SH1 and the taper portion TP1 surround the pixel aperture AP1 as seen in plan view.

The thickness decreasing portion SH1 is entirely located between the pixel aperture AP1 and the side surface SF1, and partly overlaps the upper portion 62 in a third direction Z. More specifically, the thickness decreasing portion SH1 is entirely located between the taper portion TP1 and the side surface SF1. In other words, in the example of FIG. 5, the thickness decreasing portion SH1 does not overlap the taper portion TP1 in the third direction Z. In addition, the thickness decreasing portion SH1 does not overlap the pixel aperture AP1.

In the section of FIG. 6, an end portion E2 of the organic layer OR2 is located on the rib 5. The organic layer OR2 comprises a thickness decreasing portion SH2 in which the thickness gradually decreases toward the side surface SF2 and the end portion E2. Of the upper electrode UE2 and the cap layer CP2, the thickness of the portions located on the thickness decreasing portion SH2 also gradually decreases toward the side surface SF2.

The rib 5 comprises a taper portion TP2 in which the thickness gradually decreases toward the pixel aperture AP2. The thickness decreasing portion SH2 and the taper portion TP2 surround the pixel aperture AP2 as seen in plan view.

The thickness decreasing portion SH2 is entirely located between the pixel aperture AP2 and the side surface SF2, and partly overlaps the upper portion 62 in the third direction Z. In other words, in the example of FIG. 6, the thickness decreasing portion SH2 does not overlap the pixel aperture AP2. To the contrary, the thickness decreasing portion SH2 partly overlaps the taper portion TP2.

In the section of FIG. 7, an end portion E3 of the organic layer OR3 is located on the rib 5. The organic layer OR3 comprises a thickness decreasing portion SH3 in which the thickness gradually decreases toward the side surface SF3 and the end portion E3. Of the upper electrode UE3 and the cap layer CP3, the thickness of the portions located on the thickness decreasing portion SH3 also gradually decreases toward the side surface SF3.

The rib 5 comprises a taper portion TP3 in which the thickness gradually decreases toward the pixel aperture AP3. The thickness decreasing portion SH3 and the taper portion TP3 surround the pixel aperture AP3 as seen in plan view.

The thickness decreasing portion SH3 is entirely located between the pixel aperture AP3 and the side surface SF3, and partly overlaps the upper portion 62 in the third direction Z. In other words, in the example of FIG. 7, the thickness decreasing portion SH3 does not overlap the pixel aperture AP3. To the contrary, the thickness decreasing portion SH3 partly overlaps the taper portion TP3. The width of the area in which the thickness decreasing portion SH3 overlaps the taper portion TP3 is greater than the width of the area in which the thickness decreasing portion SH2 overlaps the taper portion TP2 in FIG. 6.

The widths of the thickness decreasing portions SH1, SH2 and SH3 shown in FIG. 5 to FIG. 7 are greater than those of the taper portions TP1, TP2 and TP3, respectively. For example, the widths of the taper portions TP1, TP2 and TP3 are equal to each other. Moreover, for example, the widths of the thickness decreasing portions SH1, SH2 and SH3 are also equal to each other, and are greater than the widths of the taper portions TP1, TP2 and TP3.

As described above, in the present embodiment, distance D1 between the pixel aperture AP1 and the side surface SF1, distance D2 between the pixel aperture AP2 and the side surface SF2 and distance D3 between the pixel aperture AP3 and the side surface SF3 are different from each other and have the relationship of D1>D2>D3. The differences in the degrees of the overlaps between the thickness decreasing portion SH1 and the taper portion TP1, between the thickness decreasing portion SH2 and the taper portion TP2 and between the thickness decreasing portion SH3 and the taper portion TP3 are mainly caused by the relationship of D1, D2 and D3.

If the thickness of, of the organic layer OR1, the portion which is in contact with the lower electrode LE1 through the pixel aperture AP1 is not uniform, non-uniformity in luminance could be caused when the organic layer OR1 emits light. For this reason, it is preferred that the thickness decreasing portion SH1 should not overlap the pixel aperture AP1 like the example of FIG. 5. For the same reason, it is preferred that the thickness decreasing portion SH2 or SH3 should not overlap the pixel aperture AP2 or AP3 like the examples of FIG. 6 and FIG. 7.

It should be noted that the structure of subpixel SP1, subpixel SP2 or subpixel SP3 is not limited to the examples shown in FIG. 5 to FIG. 7.

Figure 8:
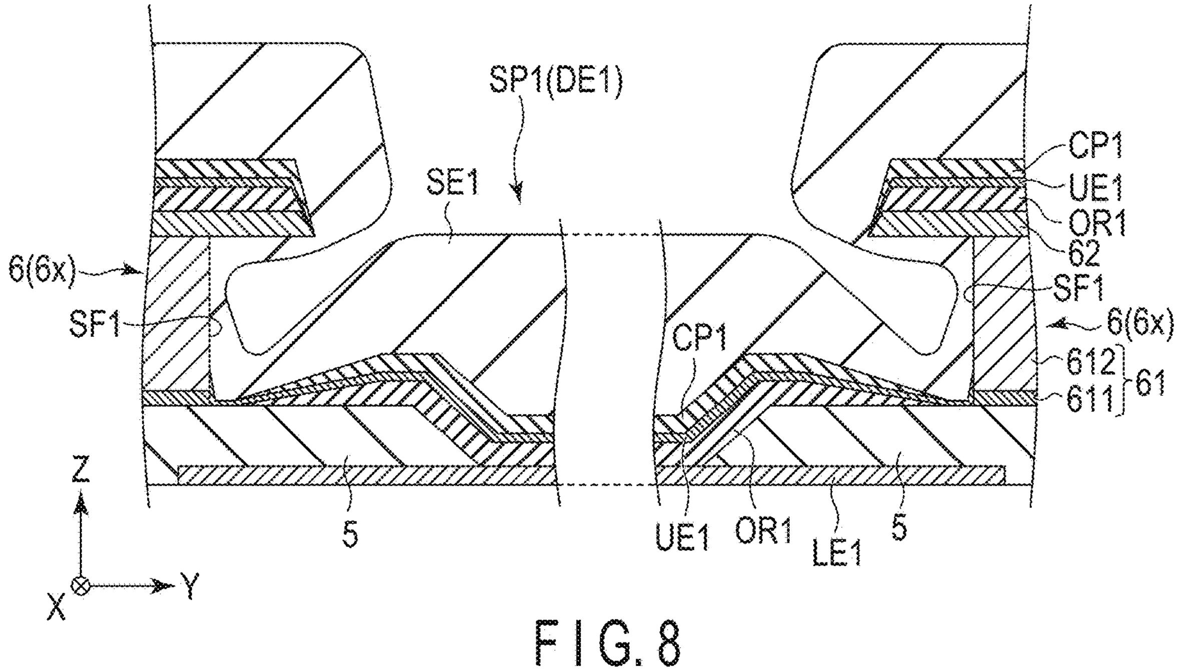
FIG. 8 is a schematic cross-sectional view showing another example of a structure which could be applied to a subpixel.

FIG. 8 is a schematic cross-sectional view showing another example of a structure which could be applied to subpixel SP1. In this example, the upper electrode UE1 is in contact with the side surfaces SF1 of the right and left partitions 6 (first partitions 6*x*).

The structures of subpixels SP2 and SP3 could be modified in a manner similar to that of FIG. 8. Specifically, the upper electrode UE2 may be in contact with the side surfaces SF2 of the right and left partitions 6 shown in FIG. 6. The upper electrode UE3 may be in contact with the side surfaces SF3 of the right and left partitions 6 shown in FIG. 7.

Now, this specification explains the manufacturing method of the display device DSP.

Figure 9:
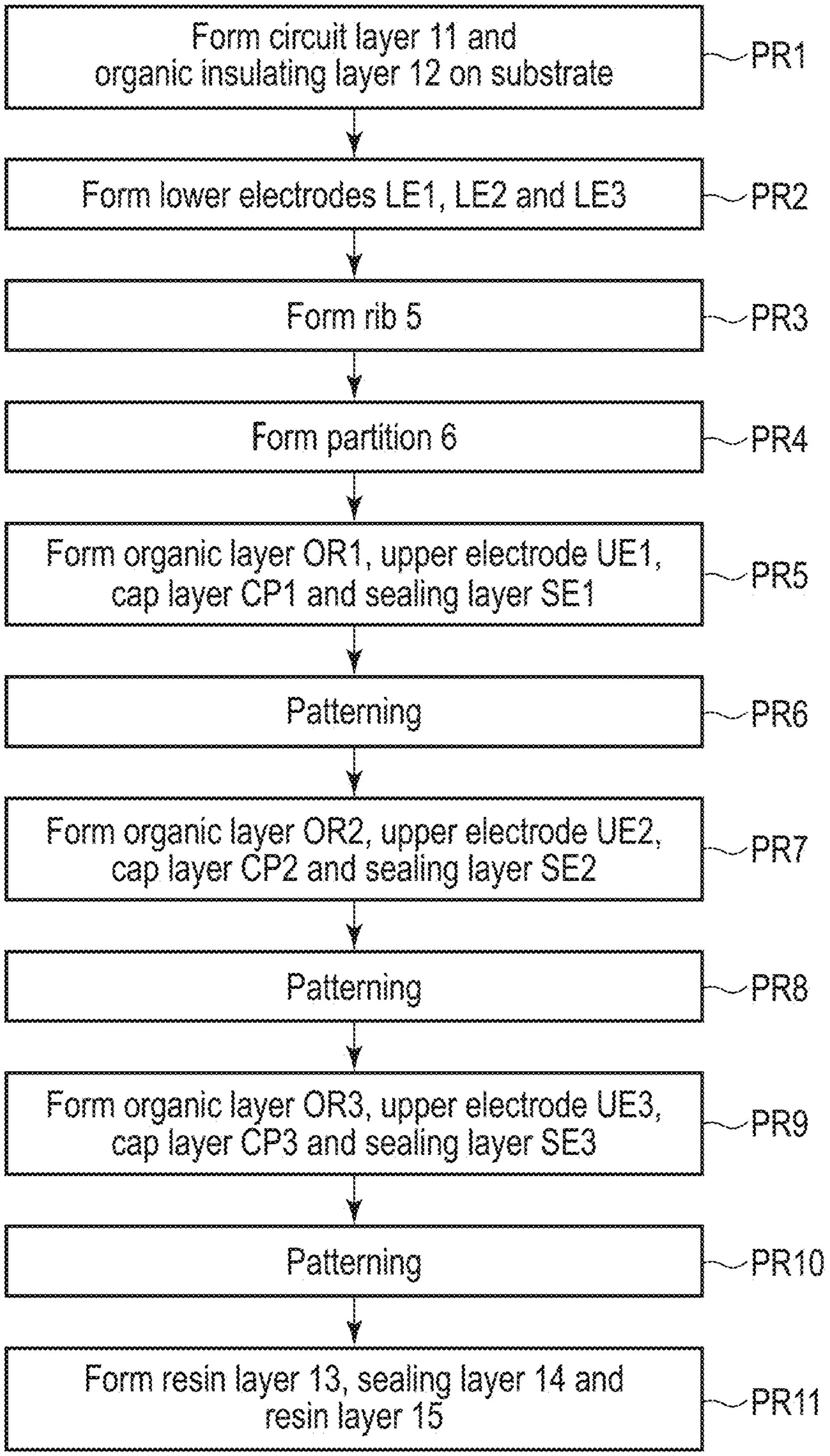
FIG. 9 is a flowchart showing an example of the manufacturing method of the display device.

FIG. 9 is a flowchart showing an example of the manufacturing method of the display device DSP. Each of FIG. 10 to FIG. 17 is a schematic cross-sectional view showing part of the manufacturing process of the display device DSP. In FIG. 10 to FIG. 17, the substrate 10, the circuit layer 11 and the like are omitted.

To manufacture the display device DSP, first, the circuit layer 11 and the organic insulating layer 12 are formed on the substrate 10 (process PR1).

Figure 10:
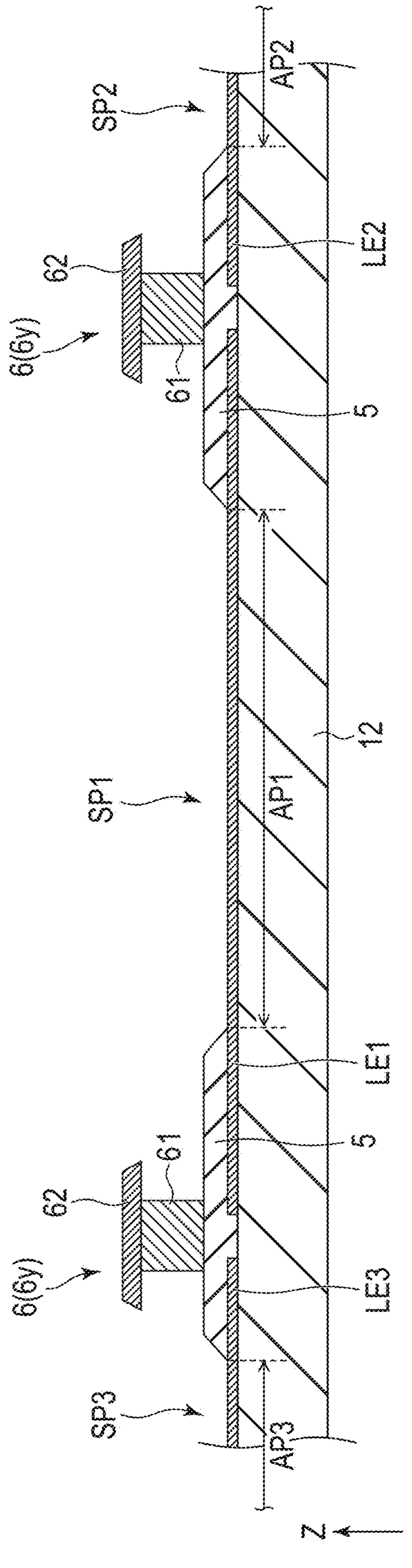
FIG. 10 is a schematic cross-sectional view showing part of the manufacturing process of the display device.

After process PR1, as shown in FIG. 10, the lower electrodes LE1, LE2 and LE3 are formed on the organic insulating layer 12 (process PR2). The rib 5 which covers the lower electrodes LE1, LE2 and LE3 is formed (process PR3). The partition 6 is formed on the rib 5 (process PR4). It should be noted that the pixel apertures AP1, AP2 and AP3 may be formed before process PR4 or may be formed after process PR4.

After process PR4, a process for forming the display elements DE1, DE2 and DE3 is performed. In the present embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

Figure 11:
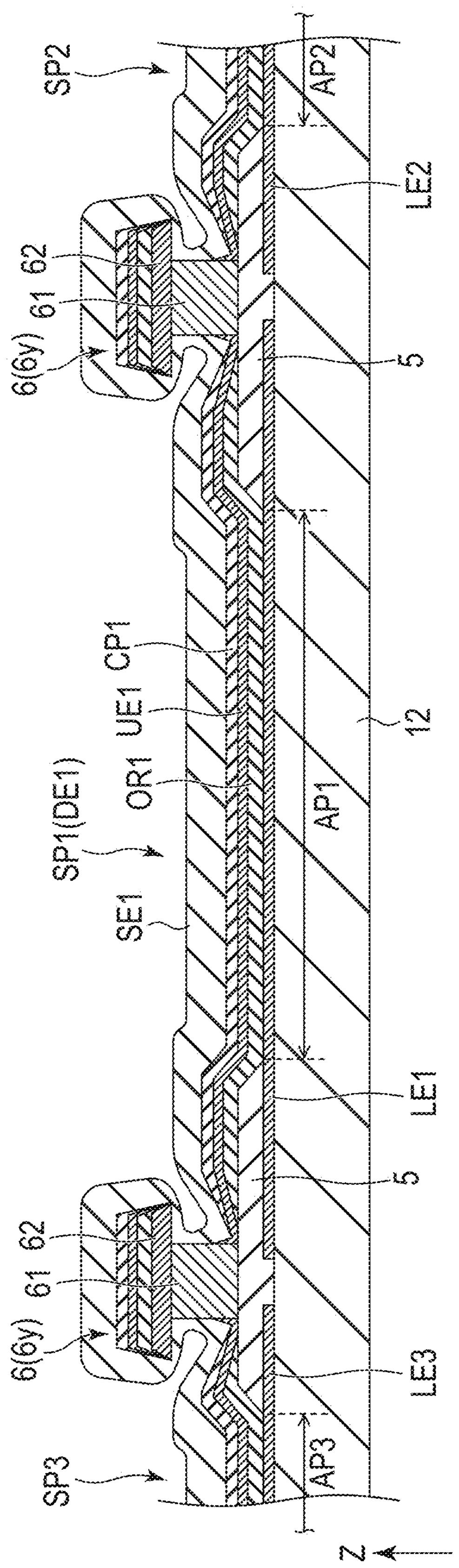
FIG. 11 is a schematic cross-sectional view showing a manufacturing process following FIG. 10.

To form the display element DE1, first, as shown in FIG. 11, the organic layer OR1 which is in contact with the lower electrode LE1 through the pixel aperture AP1, the upper electrode UE1 which covers the organic layer OR1 and the cap layer CP1 which covers the upper electrode UE1 are formed in order by vapor deposition, and further, the sealing layer SE1 which continuously covers the cap layer CP1 and the partition 6 is formed by chemical vapor deposition (CVD) (process PR5).

These organic layer OR1, upper electrode UE1, cap layer CP1 and sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

It should be noted that the section of FIG. 11 corresponds to, for example, that of FIG. 3. All of the partitions 6 shown in FIG. 11 correspond to the second partitions 6*y* shown in FIG. 2. In the example of FIG. 11, the upper electrode UE1 is in contact with the side surfaces of the lower portions 61 of these second partitions 6*y*. Alternatively, the upper electrode UE1 may not be in contact with the lower portion 61 of at least one of the second partitions 6*y*.

As shown in FIG. 5, the upper electrode UE1 is in contact with the side surface SF1 of at least one of the first partitions 6*x* which are adjacent to subpixel SP1.

Figure 12:
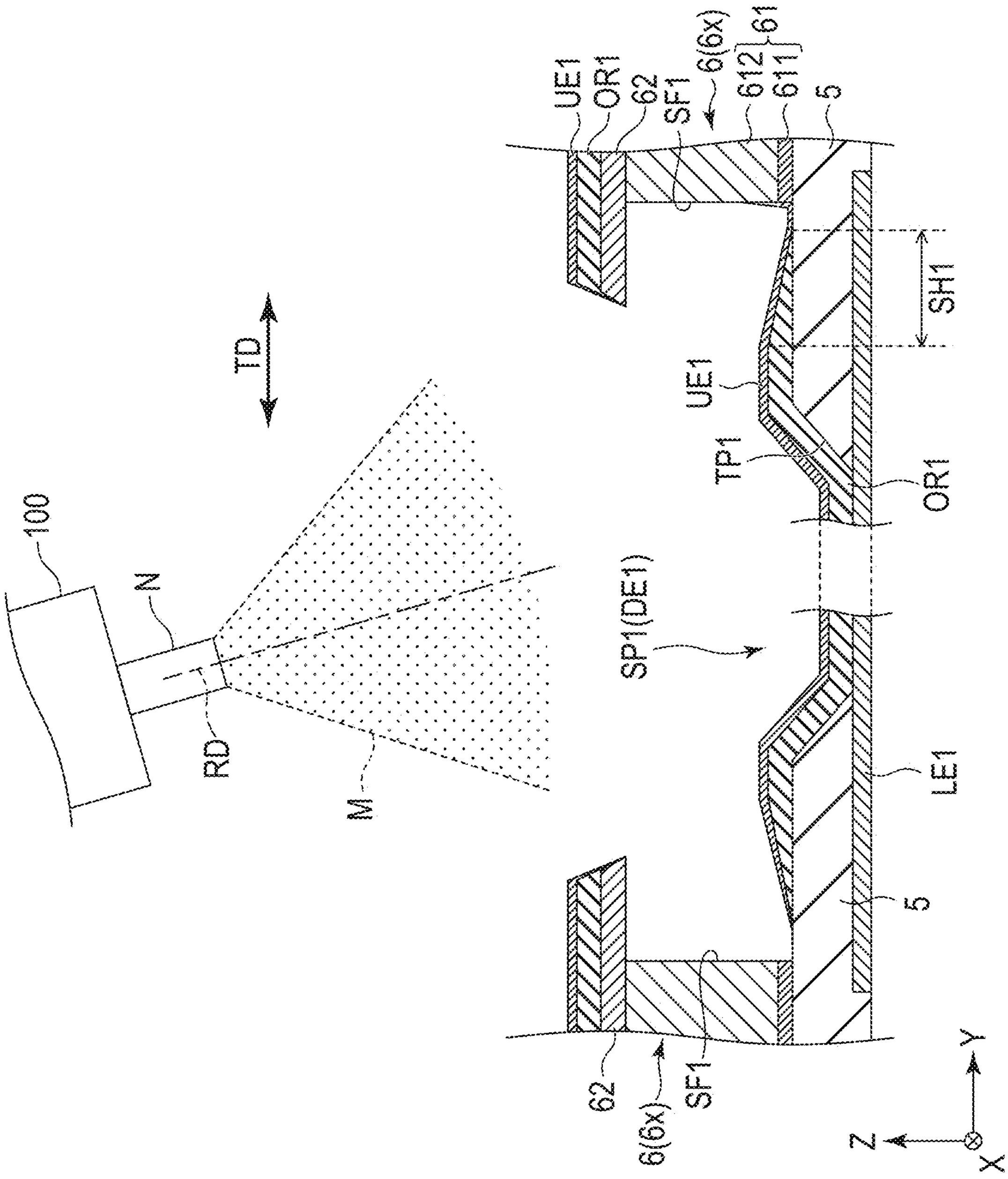
FIG. 12 is a schematic diagram showing the evaporation method of an upper electrode, etc.

FIG. 12 is a schematic diagram showing an evaporation method for obtaining the structure of such a subpixel SP1. Here, for example, the figure shows the state in which the upper electrode UE1 is formed by the evaporation material M emitted from the nozzle N of an evaporation source 100. The evaporation source 100 and the substrate as the evaporation target are relatively moved in a conveyance direction TD parallel to, for example, the second direction Y.

The evaporation material M is emitted from the nozzle N while spreading. The emission direction RD of the evaporation material M (or the extension direction of the nozzle N) inclines with respect to the third direction Z so as to face the partition 6 located on the right side of FIG. 12 (the first partition 6*x* overlapping the contact hole CH1). Thus, the evaporation material M is satisfactorily attached to the side surface SF1 of the right partition 6. To the contrary, the evaporation material M which goes to the side surface SF1 of the partition 6 located on the left side of FIG. 12 is blocked by the upper portion 62. Thus, the evaporation material M is not easily attached to this side surface SF1.

When the evaporation method of FIG. 12 is used, the upper electrode UE1 is satisfactorily attached to the side surface SF1 of one of the partitions 6. In this manner, stable conduction can be assured between the upper electrode UE1 and the partition 6.

It should be noted that each of the organic layer OR1 and the cap layer CP1 is formed by a similar evaporation method. Thus, as shown in FIG. 5, the arrangement of the organic layer OR1, the upper electrode UE1 and the cap layer CP1 is one-sided within subpixel SP1 in the Y-Z section.

When the organic layer OR1 is deposited, an area in which the evaporation material M emitted from the evaporation source 100 is blocked by the upper portion 62 and the organic layer OR1 itself formed on the upper portion 62 is generated. In this area, the organic layer OR1 becomes thin, and the thickness decreasing portion SH1 described above is formed.

Figure 13:
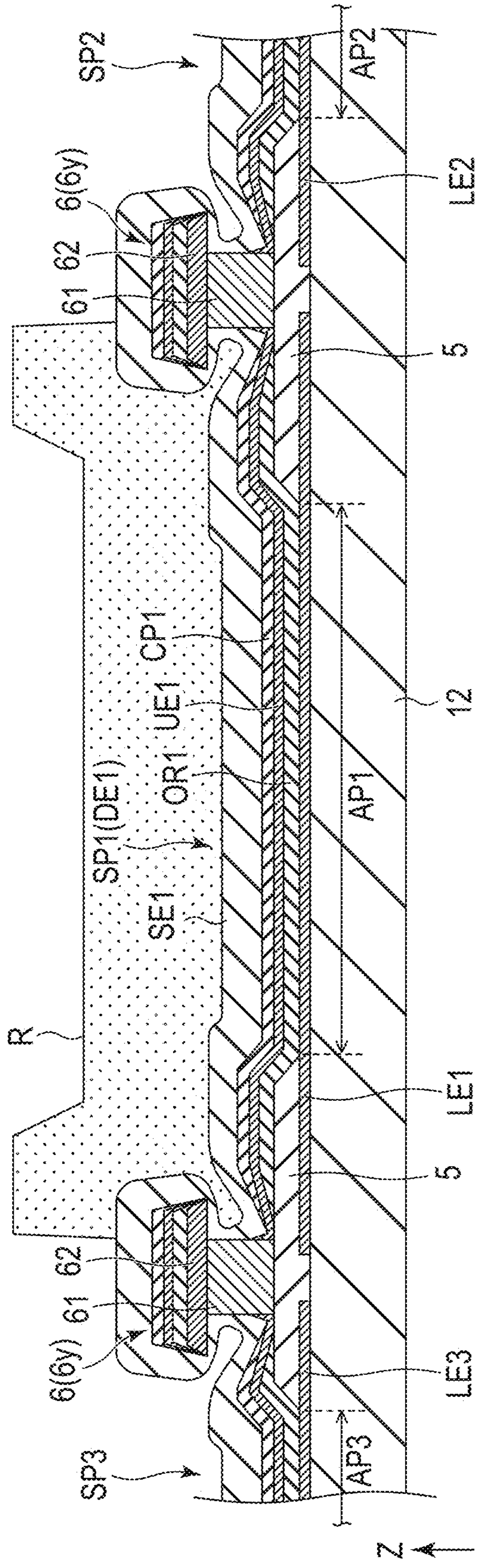
FIG. 13 is a schematic cross-sectional view showing a manufacturing process following FIG. 11.

In the flowchart of FIG. 9, after process PR5, the organic layer OR1, the upper electrode UE1, the cap layer CP1 and the sealing layer SE1 are patterned (process PR6). In this patterning, as shown in FIG. 13, a resist R is provided on the sealing layer SE1. The resist R covers subpixel SP1 and part of the partition 6 around the subpixel.

Figure 14:
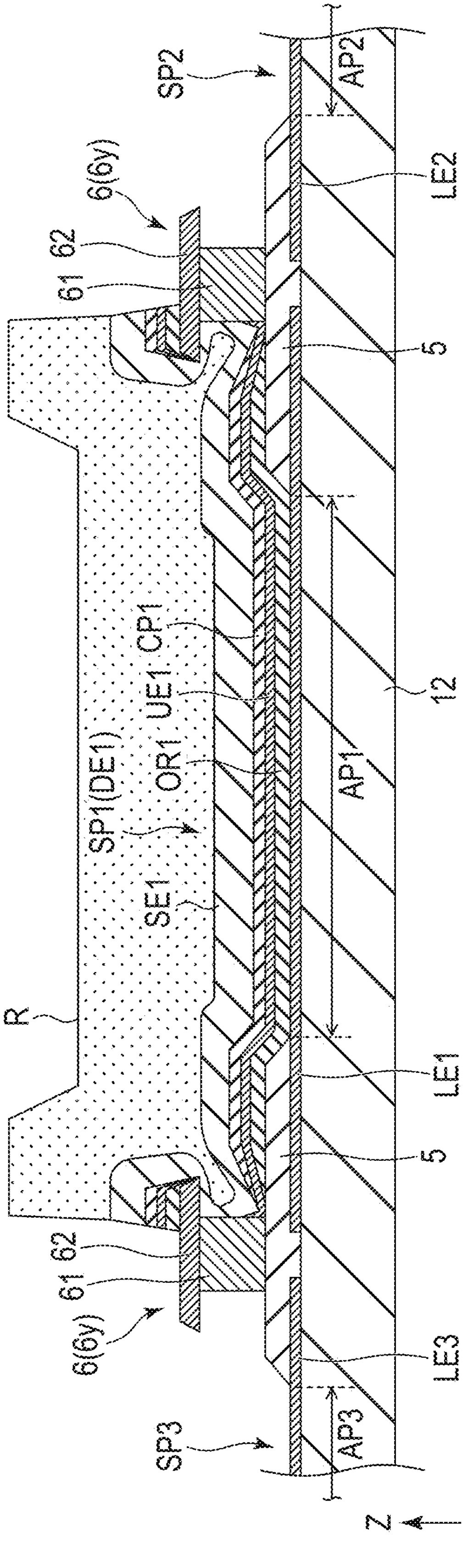
FIG. 14 is a schematic cross-sectional view showing a manufacturing process following FIG. 13.

Subsequently, as shown in FIG. 14, of the organic layer OR1, the upper electrode UE1, the cap layer CP1 and the sealing layer SE1, the portions exposed from the resist R are removed by etching using the resist R as a mask. For example, this etching includes wet etching and dry etching processes which are performed in order for the sealing layer SE1, the cap layer CP1, the upper electrode UE1 and the organic layer OR1.

Figure 15:
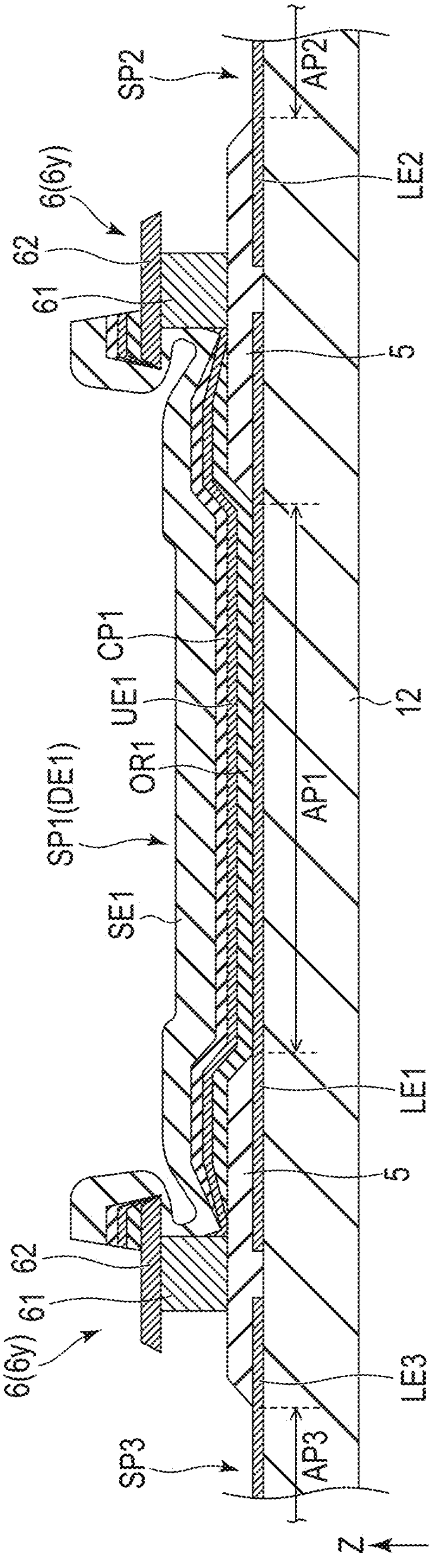
FIG. 15 is a schematic cross-sectional view showing a manufacturing process following FIG. 14.

After the process shown in FIG. 14, the resist R is removed. This process allows the acquisition of the following substrate. As shown in FIG. 15, in the substrate, the display element DE1 and the sealing layer SE1 are formed in subpixel SP1, and neither a display element nor a sealing layer is formed in subpixel SP2 or subpixel SP3.

The display element DE2 is formed by a procedure similar to that of the display element DE1. Specifically, after process PR6, the organic layer OR2 which is in contact with the lower electrode LE2 through the pixel aperture AP2, the upper electrode UE2 which covers the organic layer OR2 and the cap layer CP2 which covers the upper electrode UE2 are formed in order by vapor deposition, and further, the sealing layer SE2 which continuously covers the cap layer CP2 and the partition 6 is formed by CVD (process PR7). These organic layer OR2, upper electrode UE2, cap layer CP2 and sealing layer SE2 are formed in at least the entire display area DA and are provided in subpixels SP1 and SP3 as well as subpixel SP2.

The evaporation method of the organic layer OR2, the upper electrode UE2 and the cap layer CP2 is similar to the method explained with reference to FIG. 12. It should be noted that the direction of the inclination of the evaporation source 100 is the opposite direction of the example of FIG. 12. In this manner, a structure similar to that of FIG. 6 can be obtained in the Y-Z section.

After process PR7, the organic layer OR2, the upper electrode UE2, the cap layer CP2 and the sealing layer SE2 are patterned by wet etching and dry etching (process PR8). The flow of this patterning is similar to that of process PR6.

Figure 16:
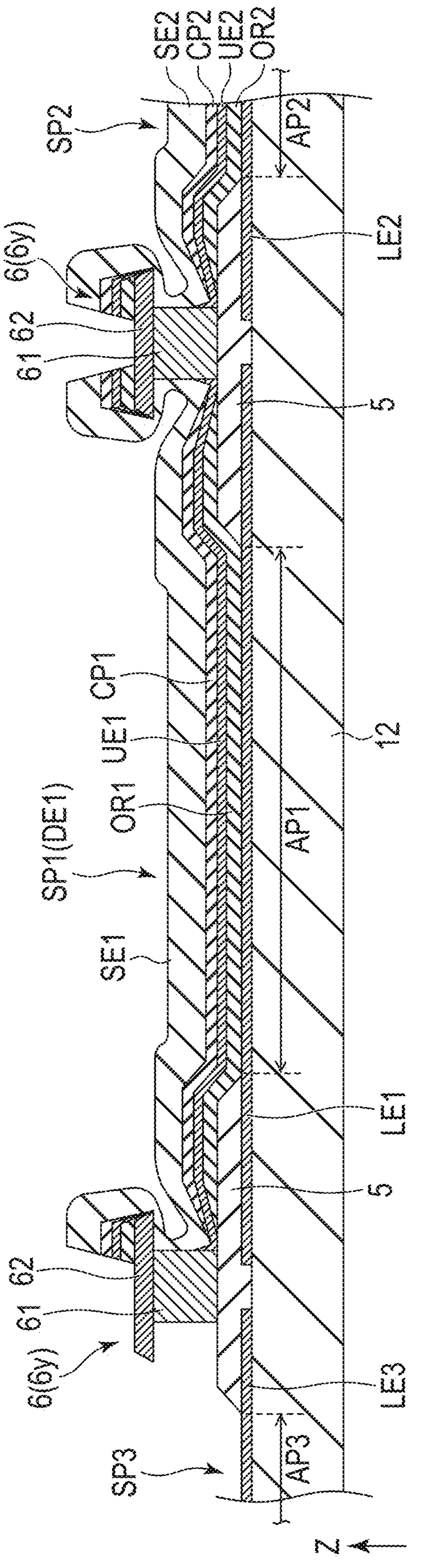
FIG. 16 is a schematic cross-sectional view showing a manufacturing process following FIG. 15.

Process PR8 allows the acquisition of the following substrate. As shown in FIG. 16, in the substrate, the display element DE1 and the sealing layer SE1 are formed in subpixel SP1, and the display element DE2 and the sealing layer SE2 are formed in subpixel SP2, and neither a display element nor a sealing layer is formed in subpixel SP3.

The display element DE3 is formed by a procedure similar to the procedures of the display elements DE1 and DE2. Specifically, after process PR8, the organic layer OR3 which is in contact with the lower electrode LE3 through the pixel aperture AP3, the upper electrode UE3 which covers the organic layer OR3 and the cap layer CP3 which covers the upper electrode UE3 are formed in order by vapor deposition, and further, the sealing layer SE3 which continuously covers the cap layer CP3 and the partition 6 is formed by CVD (process PR9). These organic layer OR3, upper electrode UE3, cap layer CP3 and sealing layer SE3 are formed in at least the entire display area DA and are provided in subpixels SP1 and SP2 as well as subpixel SP3.

The evaporation method of the organic layer OR3, the upper electrode UE3 and the cap layer CP3 is similar to the method explained with reference to FIG. 12. In this manner, a structure similar to that of FIG. 7 can be obtained in the Y-Z section.

After process PR9, the organic layer OR3, the upper electrode UE3, the cap layer CP3 and the sealing layer SE3 are patterned by wet etching and dry etching (process PR10). The flow of this patterning is similar to the flows of processes PR6 and PR8.

Figure 17:
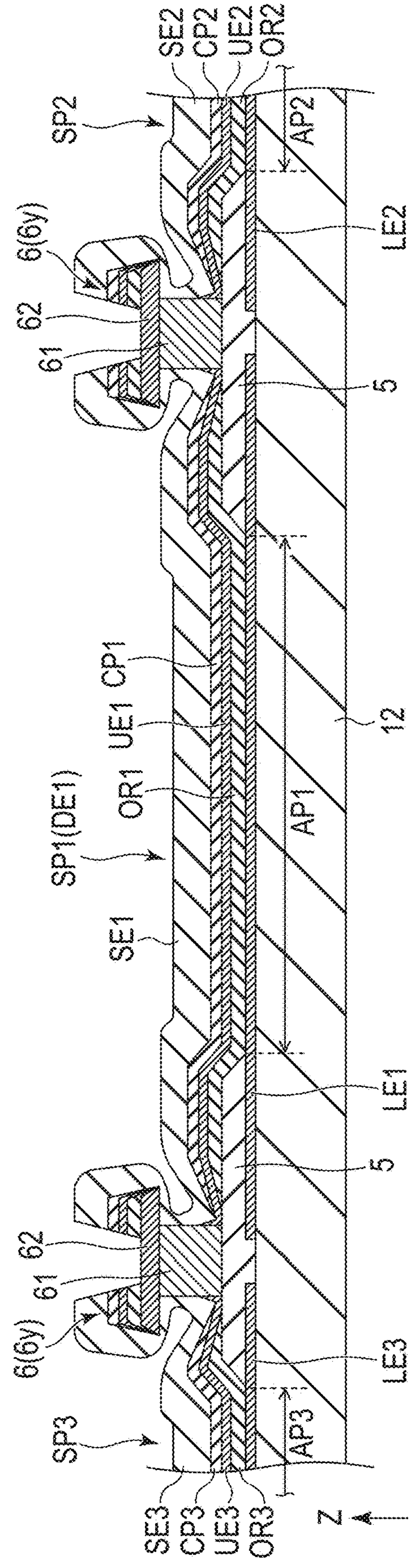
FIG. 17 is a schematic cross-sectional view showing a manufacturing process following FIG. 16.

Process PR10 allows the acquisition of the following substrate. As shown in FIG. 17, in the substrate, the display element DE1 and the sealing layer SE1 are formed in subpixel SP1, and the display element DE2 and the sealing layer SE2 are formed in subpixel SP2, and the display element DE3 and the sealing layer SE3 are formed in subpixel SP3.

After the display elements DE1, DE2 and DE3 and the sealing layers SE1, SE2 and SE3 are formed, the resin layer 13, sealing layer 14 and resin layer 15 shown in FIG. 3 are formed in order (process PR11). By this process, the display device DSP is completed.

Here, examples of the effects obtained from the present embodiment are explained.

Figure 18:
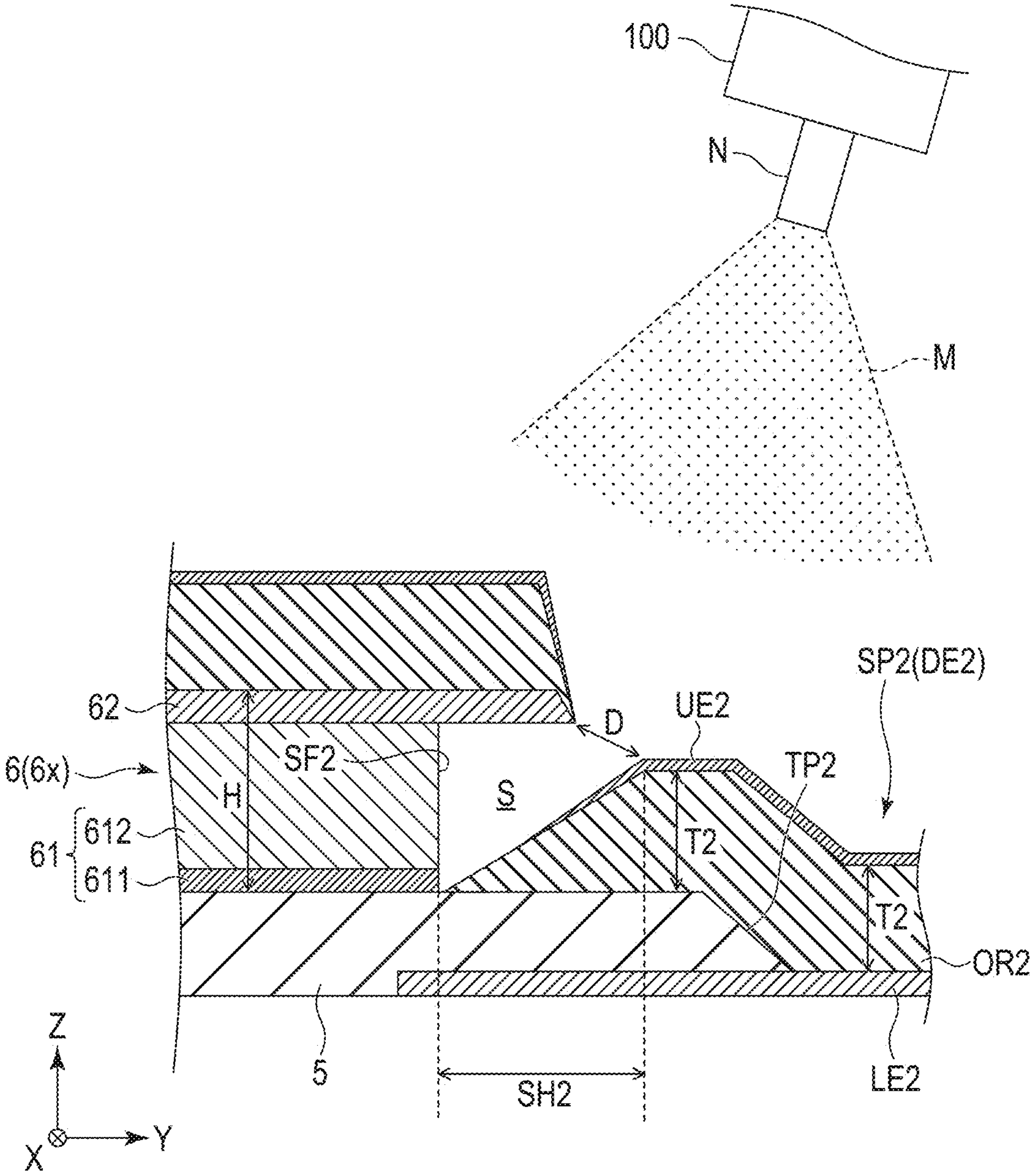
FIG. 18 is a cross-sectional view showing a comparative example of the embodiment.

FIG. 18 is a cross-sectional view showing a comparative example of the present embodiment and shows the process of forming the upper electrode UE2 in subpixel SP2 and the partition 6 near the subpixel. In this modified example, the thickness decreasing portion SH2 is entirely located on the rib 5 and does not overlap the taper portion TP2. Thus, a portion with thickness T2 is also generated in the organic layer OR2 located on the rib 5.

As described above, the organic layer OR2 is formed so as to be thicker than the organic layer OR1. Therefore, distance D between the upper portion 62 and the organic layer OR2 is less near the partition 6. In particular, when the difference between thickness T2 of the organic layer OR2 and height H of the partition 6 is less, distance D could be considerably less.

If distance D is extremely less, the evaporation material M does not easily get into the space S under the upper portion 62 when the upper electrode UE2 is deposited. Thus, there is a possibility that the upper electrode UE2 is not sufficiently in contact with the side surface SF2, thereby causing a conductive failure between the upper electrode UE2 and the partition 6.

In the present embodiment, as shown in FIG. 6, the thickness decreasing portion SH2 overlaps the taper portion TP2. In this case, as the entire thickness of the organic layer OR2 located on the rib 5 is reduced so as to be less than thickness T2, distance D can be great. By this configuration, the evaporation material M can easily get into the space S, and the upper electrode UE2 which is satisfactorily in contact with the side surface SF2 can be formed.

It should be noted that, as the organic layer OR3 is formed so as to be further thicker than the organic layer OR2, the above problem in which distance D is less becomes more serious. In the present embodiment, the thickness decreasing portion SH3 of the organic layer OR3 overlaps the taper portion TP3. In addition, the width of the area in which the thickness decreasing portion SH3 overlaps the taper portion TP3 is greater than the width of the area in which the thickness decreasing portion SH2 overlaps the taper portion TP2. When the thickness portion SH3 and the taper portion TP3 largely overlap each other, distance D can be great in the formation of the upper electrode UE3, and thus, the upper electrode UE3 which is satisfactorily in contact with the side surface SF3 of the partition 6 can be formed.

Further, in the present embodiment, distances D1, D2 and D3 from the side surfaces SF1, SF2 and SF3 of the partition 6 to the pixel apertures AP1, AP2 and AP3 are different from each other. By this configuration, a structure which is suitable for each of subpixels SP1, SP2 and SP3 can be realized. For example, as stated above, if the thickness decreasing portions SH1, SH2 and SH3 overlap the pixel apertures AP1, AP2 and AP3, non-uniformity in luminance could be caused. In this respect, in the present embodiment, distance D1 is greater than distance D2. Therefore, a sufficient margin can be assured between the thickness decreasing portion SH1 and the pixel aperture AP1. Further, since distance D2 is greater than distance D3, a large margin can be assured between the thickness decreasing portion SH2 and the pixel aperture AP2 compared with the margin between the thickness decreasing portion SH3 and the pixel aperture AP3.

The configuration of the present embodiment is advantageous to shorten the time required for the manufacturing process. For example, when the thickness of the lower portion 61 of the partition 6 is made less, the processing time for forming the partition 6 including the lower portion 61 can be shortened. For example, even when the thickness of the lower portion 61 of the partition 6 is controlled so as to be less than or equal to 500 nm, a good conduction can be assured between the upper electrodes UE2 and UE3 and the partition 6 while shortening the time required for the manufacturing process by applying the configuration of the present embodiment.

As described above, in the configuration of the present embodiment, as the conductive failure between the upper electrodes UE2 and UE3 and the partition 6 is prevented, the yield of the manufacturing process of the display device DSP is improved. Various other desirable effects can be obtained from the present embodiment.

Second Embodiment

A second embodiment is explained. Structures similar to those of the first embodiment can be applied to portions which are not particularly referred to in the structures of the display device DSP of the present embodiment.

Figure 19:
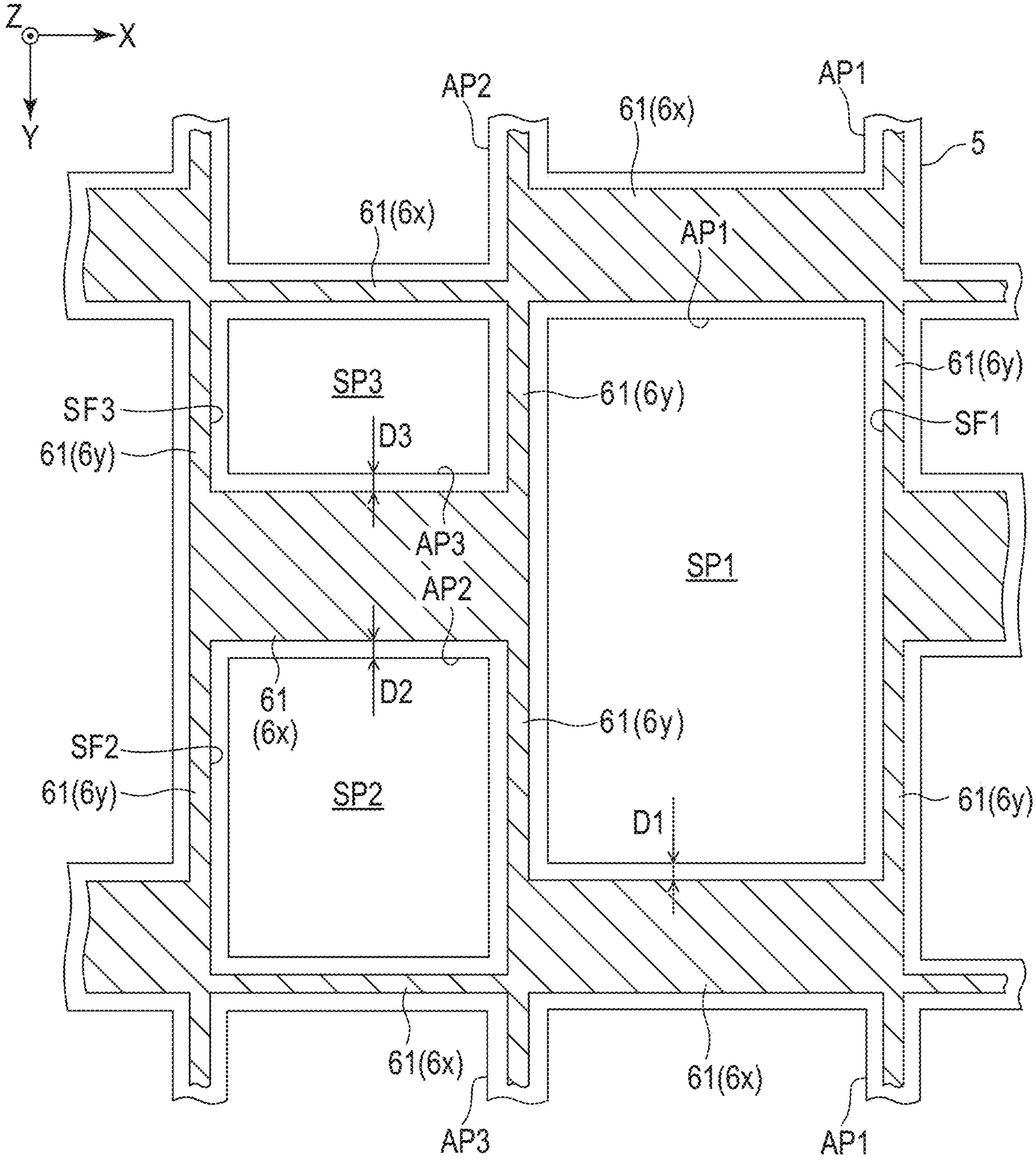
FIG. 19 is a schematic plan view of a rib and the lower portion of a partition according to a second embodiment.

FIG. 19 is a schematic plan view of a rib 5 and the lower portion 61 of a partition 6 in the display device DSP according to the present embodiment. In the present embodiment, distance D1 between a pixel aperture AP1 and a side surface SF1, distance D2 between a pixel aperture AP2 and a side surface SF2 and distance D3 between a pixel aperture AP3 and a side surface SF3 are equal to each other (D1=D2=D3).

For example, distances D1, D2 and D3 are equal to distance D3 of the first embodiment. In this case, the cross-sectional structure of subpixel SP3 is the same as the example of FIG. 7. The cross-sectional structure of subpixel SP2 is also substantially the same as the example of FIG. 6. However, the width of the area in which a thickness decreasing portion SH2 overlaps a taper portion TP2 is increased compared with the example of FIG. 6. Regarding subpixel SP1, in the example of FIG. 5, the thickness decreasing portion SH1 does not overlap the taper portion TP1. However, in the present embodiment, they overlap each other in a manner similar to that of a thickness decreasing portion SH3 and a taper portion TP3.

In this manner, even when the distances between the lower portion 61 and the pixel apertures AP1, AP2 and AP3 are standardized according to the distance which is suitable for the thickest organic layer OR3, a good conduction can be assured between upper electrodes UE1, UE2 and UE3 and the lower portion 61 in a manner similar to that of the first embodiment.

Further, in the present embodiment, the aperture areas of the pixel apertures AP1 and AP2 are greater than those of the first embodiment. Thus, the light emitting areas in display elements DE1 and DE2 are made large, thereby improving the luminance of subpixels SP1 and SP2.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:

a first lower electrode;

a second lower electrode;

a rib comprising a first pixel aperture which overlaps the first lower electrode and a second pixel aperture which overlaps the second lower electrode;

a partition including a lower portion which is provided on the rib between the first pixel aperture and the second pixel aperture and an upper portion which protrudes from a side surface of the lower portion;

a first organic layer which covers the first lower electrode through the first pixel aperture and emits light based on application of voltage;

a second organic layer which covers the second lower electrode through the second pixel aperture and emits light based on application of voltage;

a first upper electrode which covers the first organic layer and is in contact with a first side surface of the lower portion; and a second upper electrode which covers the second organic layer and is in contact with a second side surface of the lower portion, wherein a first distance between the first side surface and the first pixel aperture is different from a second distance between the second side surface and the second pixel aperture.

2. The display device of claim 1, wherein the second organic layer is thicker than the first organic layer, and the second distance is less than the first distance.

3. The display device of claim 1, wherein the rib comprises a first taper portion which surrounds the first pixel aperture and in which a thickness decreases toward the first pixel aperture, and a second taper portion which surrounds the second pixel aperture and in which a thickness decreases toward the second pixel aperture, the first organic layer comprises a first end portion located on the rib and a first thickness decreasing portion in which a thickness decreases toward the first end portion, the second organic layer comprises a second end portion located on the rib and a second thickness decreasing portion in which a thickness decreases toward the second end portion, the first thickness decreasing portion is entirely located between the first taper portion and the first side surface, and the second thickness decreasing portion covers at least part of the second taper portion.

4. The display device of claim 3, wherein a width of the first thickness decreasing portion is greater than a width of the first taper portion, and a width of the second thickness decreasing portion is greater than a width of the second taper portion.

5. The display device of claim 1, further comprising:

a third lower electrode;

a third organic layer which covers the third lower electrode through a third pixel aperture provided in the rib, and emits light based on application of voltage; and a third upper electrode which covers the third organic layer and is in contact with a third side surface of the lower portion, wherein the first distance, the second distance and a third distance between the third side surface and the third pixel aperture are different from each other.

6. The display device of claim 5, wherein the second organic layer is thicker than the first organic layer, and the second distance is less than the first distance.

7. The display device of claim 6, wherein the third organic layer is thicker than the second organic layer, and the third distance is less than the second distance.

8. A display device comprising:

a first lower electrode;

a second lower electrode;

a rib comprising a first pixel aperture which overlaps the first lower electrode and a second pixel aperture which overlaps the second lower electrode;

a partition including a lower portion which is provided on the rib between the first pixel aperture and the second pixel aperture and an upper portion which protrudes from a side surface of the lower portion;

a first organic layer which covers the first lower electrode through the first pixel aperture and emits light based on application of voltage;

a second organic layer which covers the second lower electrode through the second pixel aperture and emits light based on application of voltage;

a first upper electrode which covers the first organic layer and is in contact with a first side surface of the lower portion; and a second upper electrode which covers the second organic layer and is in contact with a second side surface of the lower portion, wherein a first distance between the first side surface and the first pixel aperture is greater than a second distance between the second side surface and the second pixel aperture.

9. The display device of claim 8, wherein the rib comprises a first taper portion which surrounds the first pixel aperture and in which a thickness decreases toward the first pixel aperture, and a second taper portion which surrounds the second pixel aperture and in which a thickness decreases toward the second pixel aperture, the first organic layer comprises a first end portion located on the rib and a first thickness decreasing portion in which a thickness decreases toward the first end portion, the second organic layer comprises a second end portion located on the rib and a second thickness decreasing portion in which a thickness decreases toward the second end portion, the first thickness decreasing portion is entirely located between the first taper portion and the first side surface, and the second thickness decreasing portion covers at least part of the second taper portion.

10. The display device of claim 9, wherein a width of the first thickness decreasing portion is greater than a width of the first taper portion, and a width of the second thickness decreasing portion is greater than a width of the second taper portion.

11. The display device of claim 10, further comprising:

a third lower electrode;

a third organic layer which covers the third lower electrode through a third pixel aperture provided in the rib, and emits light based on application of voltage; and a third upper electrode which covers the third organic layer and is in contact with a third side surface of the lower portion, wherein the first distance, the second distance and a third distance between the third side surface and the third pixel aperture are different from each other.

12. The display device of claim 11, wherein the third distance is smaller than the second distance.

13. The display device of claim 12, wherein the third organic layer is thicker than the first organic layer or the second organic layer.

14. A display device comprising:

a substrate;

a first lower electrode and a second lower electrode overlapping the substrate in a plan view;

a rib formed of an inorganic insulating material, the rib provided on the first lower electrode and the second lower electrode and including a first pixel aperture overlapping in the plan view with the first lower electrode, and a second pixel aperture overlapping in the plan view with the second lower electrode; and a partition including a lower portion provided on the rib, and an upper portion provided on the lower portion and extending beyond a side surface of the lower portion, wherein a first distance in the plan view between a first edge of the first pixel aperture and the lower portion of the partition is greater than a second distance in the plan view between a second edge of the second pixel aperture and the lower portion of the partition.

15. The display device according to claim 14, further comprising:

a first organic layer provided on the rib and in contact with the first lower electrode via the first pixel aperture, the first organic layer including a first light emitting layer and having a first thickness in a Z direction, which is a direction normal to a largest surface of the substrate, inside the first pixel aperture; and a second organic layer provided on the rib and in contact with the second lower electrode via the second pixel aperture, the second organic layer including a second light emitting layer and having a second thickness in the Z direction inside the second pixel aperture, wherein the first light emitting layer emits a first color light, the second light emitting layer emits a second color light different from the first color light, and the second thickness is greater than the first thickness.

16. The display device according to claim 15, wherein the rib further includes:

a first taper portion where a thickness of the rib in the Z direction gradually decreases in a direction from the lower portion of the partition to the first edge; and a second taper portion where a thickness of the rib in the Z direction gradually decreases in a direction from the lower portion of the partition to the second edge, the first organic layer further includes a first thickness decreasing portion where a thickness of the first organic layer in the Z direction gradually decreases in a direction from the first edge to the lower portion of the partition, the second organic layer further includes a second thickness decreasing portion where a thickness of the second organic layer in the Z direction gradually decreases in a direction from the second edge to the lower portion of the partition, and a second area of a second overlapping portion where the second thickness decreasing portion overlaps the second taper portion is greater than a first area of a first overlapping portion where the first thickness decreasing portion overlaps the first taper portion.

17. The display device according to claim 16, further comprising:

a first upper electrode provided on the first organic layer, and a second upper electrode provided on the second organic layer, wherein the lower portion of the partition is formed of a conductive material, the first upper electrode is in contact with the lower portion of the partition, and the second upper electrode is in contact with the lower portion of the partition.

18. The display device according to claim 17, further comprising:

a third lower electrode provided between the substrate and the rib, wherein the rib further includes a third pixel aperture overlapping the third lower electrode, and the second distance in the plan view is greater than a third distance in the plan view between a third edge of the third pixel aperture and the lower portion of the partition.

19. The display device according to claim 18, further comprising:

a third organic layer provided on the rib and in contact with the third lower electrode via the third pixel aperture, the third organic layer including a third light emitting layer and having a third thickness in the Z direction inside the third pixel aperture, wherein the third light emitting layer emits a third color light different from the first color light and the second color light, and the third thickness is greater than the second thickness.

20. The display device according to claim 19, wherein the rib further comprises a third taper portion where a thickness of the rib in the Z direction gradually decreases in a direction from the lower portion of the partition to the third edge, the third organic layer further includes a third thickness decreasing portion where a thickness of the third organic layer in the Z direction gradually decreases in a direction from the third edge to the lower portion of the partition, a third area of a third overlapping portion where the third thickness decreasing portion overlaps the third taper portion is greater than the second area of the second overlapping portion.

21. The display device according to claim 20, further comprising:

a third upper electrode provided on the third organic layer, wherein the third upper electrode is in contact with the lower portion of the partition.

22. The display device according to claim 14, wherein an area of the first pixel aperture is greater than an area of the second pixel aperture.

23. The display device according to claim 18, wherein an area of the first pixel aperture is greater than an area of the second pixel aperture, and the area of the second pixel aperture is greater than an area of the third pixel aperture.

24. The display device according to claim 15, wherein the first color light is blue, and the second color light is green.

25. The display device according to claim 19, wherein the first color light is blue, the second color light is green, and the third color light is red.

26. The display device according to claim 14, wherein a fourth area of the rib between the first pixel aperture and the partition in the plan view is greater than a fifth area of the rib between the second pixel aperture and the partition in the plan view.

27. The display device according to claim 18, wherein a fourth area of the rib between the first pixel aperture and the partition in the plan view is greater than a fifth area of the rib between the second pixel aperture and the partition in the plan view, and the fifth area of the rib between the second lower electrode and the partition in the plan view is greater than a sixth area of the rib between the third lower electrode and the partition in the plan view.

* * * * *